United States Patent
Kim et al.

(10) Patent No.: US 8,298,372 B2
(45) Date of Patent: Oct. 30, 2012

(54) QUARTZ WINDOW HAVING GAS FEED AND PROCESSING EQUIPMENT INCORPORATING SAME

(75) Inventors: Tae Jung Kim, Kyeong-Ki (KR); Martin Ripley, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 12/759,873

(22) Filed: Apr. 14, 2010

(65) Prior Publication Data

US 2010/0267249 A1    Oct. 21, 2010

Related U.S. Application Data

(60) Provisional application No. 61/170,867, filed on Apr. 20, 2009.

(51) Int. Cl.
*C23F 1/10* (2006.01)
*H01L 21/306* (2006.01)

(52) U.S. Cl. .......... 156/345.5; 156/345.34; 156/345.42; 392/411; 392/416

(58) Field of Classification Search .............. 156/345.5, 156/345.34, 345.42
See application file for complete search history.

(56) References Cited

U.S. PATENT DOCUMENTS

| | | | | |
|---|---|---|---|---|
| 5,985,091 | A | * 11/1999 | Suzuki | .......... 156/345.42 |
| 6,099,648 | A | 8/2000 | Anderson | |
| 6,187,133 | B1 | * 2/2001 | Knoot | .......... 156/345.34 |
| 7,442,274 | B2 | 10/2008 | Maruyama | |
| 2008/0127895 | A1 | 6/2008 | Shao et al. | |

FOREIGN PATENT DOCUMENTS

WO    WO 99/49101    9/1999

OTHER PUBLICATIONS

International Search Report and Written Opinion mailed Oct. 27, 2010 for PCT Application No. PCT/US2010/031157.

* cited by examiner

*Primary Examiner* — Mohsen Ahmadi
(74) *Attorney, Agent, or Firm* — Moser Taboada; Alan Taboada

(57) ABSTRACT

Methods and apparatus for providing a process gas to a substrate in a processing system are disclosed herein. In some embodiments, the substrate processing system may include a process chamber having a substrate support disposed therein; a light source disposed above the process chamber to direct energy towards the substrate support; and a window assembly disposed between the light source and the substrate support to allow light energy provided by the light source to enter the process chamber towards the substrate support, wherein the window assembly includes an inlet to receive a process gas and one or more outlets to distribute the process gas into the process chamber.

20 Claims, 4 Drawing Sheets

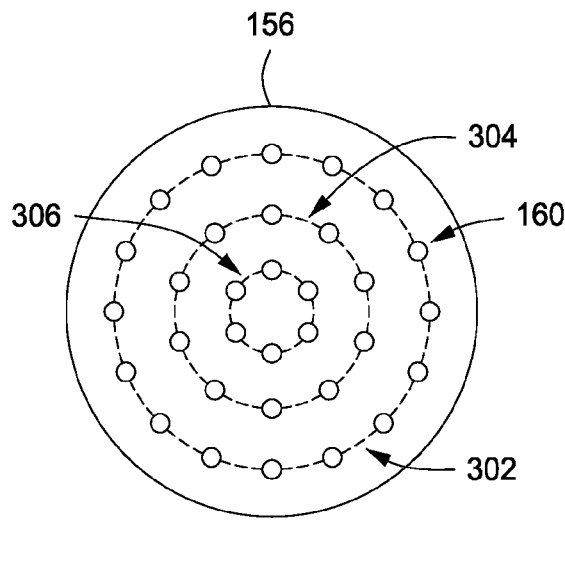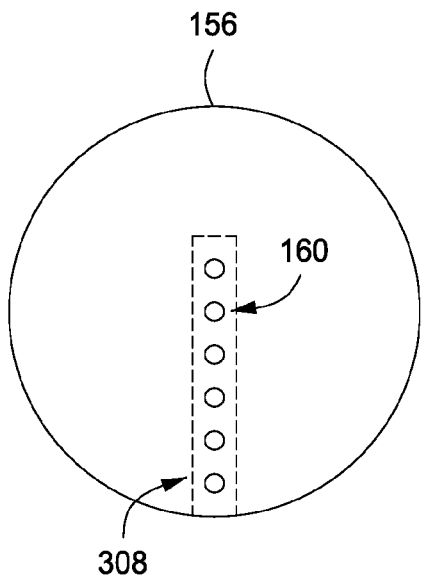
FIG. 3A  FIG. 3B
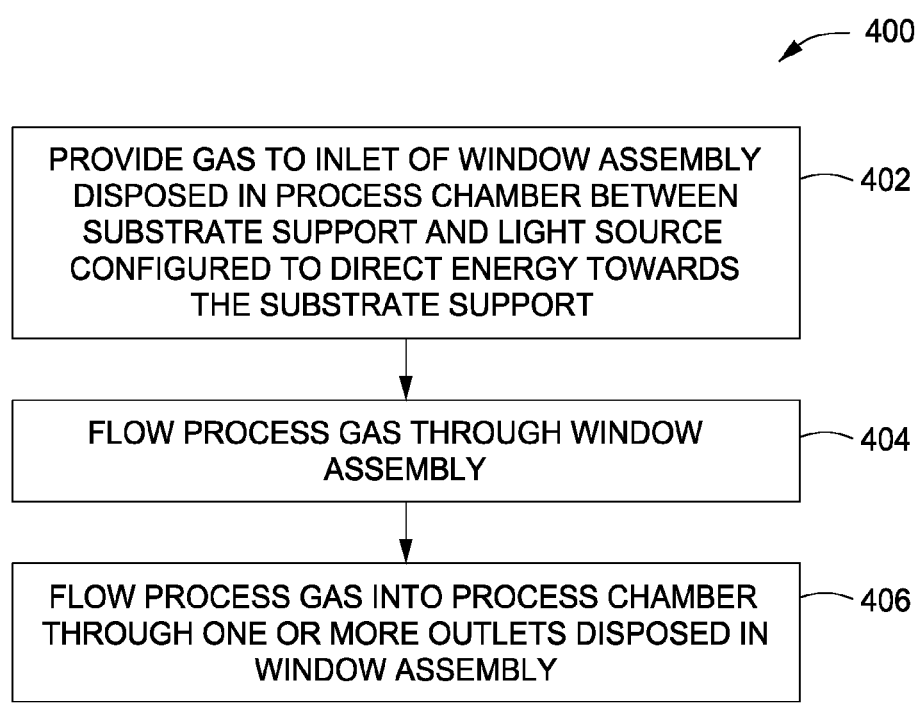
FIG. 4

QUARTZ WINDOW HAVING GAS FEED AND PROCESSING EQUIPMENT INCORPORATING SAME

CROSS-REFERENCE TO RELATED APPLICATIONS

This application claims benefit of U.S. provisional patent application Ser. No. 61/170,867, filed Apr. 20, 2009, which is herein incorporated by reference in its entirety.

FIELD

Embodiments of the present invention generally relate to semiconductor processing equipment.

BACKGROUND

In some semiconductor process chambers, for example, Rapid Thermal Process (RTP) chambers, process gases may be injected from the side and flowed across the surface of a substrate. In such process chambers, high intensity lamps are typically disposed above the substrate support and span substantially over the length of the chamber ceiling. Thus, injecting process gases from above in such a chamber is not typical because the positioning of the lamps may prevent such configurations.

Unfortunately, the inventors have observed that side injection of process gases can result in non-uniform processing of the substrate. For example, in an oxidation process, an oxide layer may have a higher growth rate at the peripheral edge of the substrate proximate a side injecting gas inlet than at a middle portion of the substrate because the concentration of process gas at the peripheral edge of the substrate may be greater.

Accordingly, the inventors have provided semiconductor processing equipment that facilitates more uniform processing of a substrate disposed therein.

SUMMARY

Methods and apparatus for providing a process gas to a substrate in a processing system are disclosed herein. In some embodiments, the substrate processing system may include a process chamber having a substrate support disposed therein; a light source disposed above the process chamber to direct energy towards the substrate support; and a window assembly disposed between the light source and the substrate support to allow light energy provided by the light source to enter the process chamber towards the substrate support, wherein the window assembly includes an inlet to receive a process gas and one or more outlets to distribute the process gas into the process chamber.

In some embodiments, the window assembly may further include an upper window; and a lower window disposed below the upper window and defining a gap therebetween to flow the process gas provided from the inlet, wherein the one or more outlets are disposed in the lower window. In some embodiments, the window assembly may further include an upper window; and a conduit disposed below the upper window and having the inlet disposed at a first end thereof to receive the process gas, wherein the conduit has one or more outlets to flow the process gas into the process chamber. In some embodiments, the window assembly may further include a second conduit disposed below the upper window to flow a second process gas therethrough and having one or more second outlets disposed therethrough to facilitate the flow of the second process gas into the process chamber.

In some embodiments, a method for providing a process gas to a substrate may include providing a gas to an inlet of a window assembly disposed in a process chamber between a substrate support and a light source configured to direct energy towards the substrate support; flowing the gas through the window assembly; and flowing the gas into the process chamber through one or more outlets disposed in the window assembly. Other and further embodiments are disclosed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-B depict partial schematic bottom views of a gas delivery system of a rapid thermal processing system in accordance with some embodiments of the present invention.

FIG. 4 depicts a flow chart for a method of providing a process gas to a substrate in accordance with some embodiments of the present invention.

To facilitate understanding, identical reference numerals have been used, where possible, to designate identical elements that are common to the figures. The above drawings are not to scale and may be simplified for illustrative purposes.

DETAILED DESCRIPTION

Methods and apparatus for delivering a process gas to a substrate in a substrate processing system are disclosed herein. The inventive apparatus may include process chamber having a window assembly for controlling the flow of a process gas into a semiconductor process chamber. The inventive methods and apparatus advantageously facilitate providing a desired distribution of a process gas to a substrate disposed in a process chamber, for example, such as a process chamber configured for a rapid thermal process (RTP).

In the following description, the term substrate is intended to broadly cover any object that is being processed in a thermal process chamber. The term substrate may include, for example, semiconductor wafers, flat panel displays, glass plates or disks, plastic workpieces, and the like.

Figure 1:
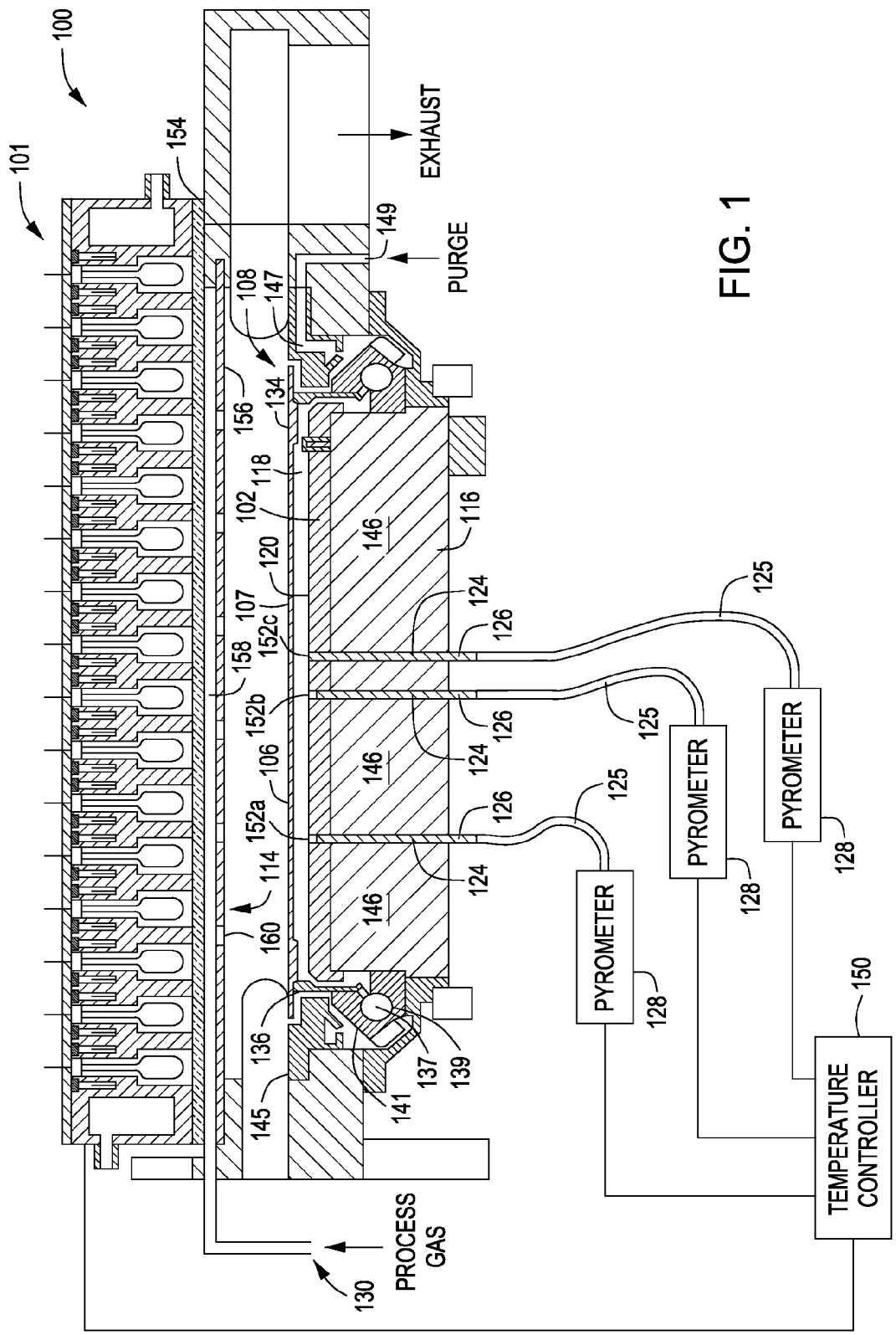
FIG. 1 depicts a schematic side view of a rapid thermal processing system in accordance with some embodiments of the present invention.

FIG. 1 depicts a Rapid Thermal Processing system (RTP) in accordance with some embodiments of the present invention. Exemplary RTP chambers may include the RADIANCE® or RADIANCEPlus chambers available from Applied Materials, Inc of Santa Clara, Calif. The RTP system may include a process chamber 100 having a lamphead 101 for processing a substrate 106. The substrate 106 may be any suitable substrate requiring processing, for example, by rapid thermal processing. The substrate 106 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 106 may be, for example, a disk-shaped, eight inch (200 mm) or twelve inch (300 mm) diameter silicon substrate.

The substrate 106 is mounted inside the chamber 100 on a substrate support 108 and is heated by the lamphead 101, which is disposed in a position opposing the substrate support 108. The lamphead 101 generates radiation which is directed to a front side 107 of the substrate 106. Alternatively (not shown), the lamphead 101 may be configured to heat the back side of the substrate 106, for example, such as by being disposed below the substrate 106, or by directing the radiation to the back side of the substrate 106. The radiation enters the process chamber 100 through a water-cooled quartz window assembly 114. Beneath the substrate 106 is a reflector 102, which is mounted on a water-cooled, stainless steel base 116. The base 116 includes a circulation circuit 146 through which coolant circulate to cool the reflector 102. In some embodiments, the reflector 102 is made of aluminum and has a highly reflective surface coating 120. Water, which may be above 23 degrees Celsius, may be circulated through the base 116 to keep the temperature of the reflector 102 well below that of the heated substrate 106. Alternatively, other coolants may be provided at the same or different temperatures. For example, antifreeze (e.g., ethylene glycol, propylene glycol, or the like) or other heat transfer fluids may be circulated through the base 116 and/or the base 116 may be coupled to a chiller (not shown). An underside or backside of the substrate 106 and the top of the reflector 102 form a reflecting cavity 118. The reflecting cavity 118 enhances the effective emissivity of the substrate 106.

In some embodiments, the separation between the substrate 106 and the reflector 102 may be approximately 0.3 of an inch (7.6 mm), thus forming the reflecting cavity 118 which has a width-to-height ratio of about 27. In processing systems that are designed for eight-inch silicon wafers, the distance between the substrate 106 and the reflector 102 is about 3-9 mm. The width-to-height ratio of the cavity 118 should be larger than about 20:1. If the separation is made too large, the emissivity-enhancement effect that is attributable to the virtual blackbody cavity that is formed will decrease. If the separation is too small, for example less than about 3 mm, then the thermal conduction from the substrate 106 to the reflector 102 will increase, thereby imposing a large thermal load on the heated substrate 106, since the main mechanism for heat loss to the reflecting plate will be conduction through the gas. The thermal loading will depend upon the type of process gas and the chamber pressure during processing.

The temperatures at localized regions of the substrate 106 are measured by a plurality of temperature probes, such as 152a, 152b, and 152c. Each temperature probe includes a sapphire light pipe 126 that passes through a conduit 124 that extends from the backside of the base 116 through the top of the reflector 102. In some embodiments, the sapphire light pipe 126 is about 0.125 inch in diameter and the conduit 124 is slightly larger. The sapphire light pipe 126 is positioned within the conduit 124 so that its uppermost end is flush with or slightly below the upper surface of the reflector 102. The other end of light pipe 126 couples to a flexible optical fiber 125 that transmits sampled light from the reflecting cavity 118 to a pyrometer 128.

The pyrometer 128 is connected to a temperature controller 150 which controls the power supplied to the lamphead 101 in response to a measured temperature. In some embodiments, such as for a 200 mm wafer, the lamphead 101 may use 187 lights to deliver highly collimated radiation from tungsten-halogen lamps to the process chamber 100. In some embodiments, such as for a 300 mm wafer, the lamphead 101 may use 409 lights. The number and configuration of the lights disclosed herein are exemplary and other numbers and configurations may also suitably be used.

The lamps may be divided into multiple zones. The zones can be individually adjusted by the controller to allow controlled radiative heating of different areas of the substrate 106. Such a control system is described in U.S. Pat. No. 5,755,511, assigned to the assignee of the present invention, the entire disclosure of which is incorporated herein by reference.

As indicated above, the described embodiments use measurement or temperature probes distributed over the reflector 102 so as to measure the temperature at different radii of the substrate 106. During the thermal processing, the substrate 106 is rotated, for example, at about 240 rpm. Thus, each probe actually samples the temperature profile of a corresponding annular ring area on the substrate 106.

The substrate support 108 may be configured to be stationary of may rotate the substrate 106. The substrate support 108 includes a support or an edge ring 134 which contacts the substrate 106 around the substrate's outer perimeter, thereby leaving the entire underside of the substrate 106 exposed except for a small annular region about the outer perimeter. The support ring 134 is also known as the edge ring 134 and these two terms can be interchangeably used within the specification. In some embodiment, the support ring 134 has a radial width of approximately one inch (2.5 centimeters (cm)). To minimize the thermal discontinuities that will occur at the edge of the substrate 106 during processing, the support ring 134 is made of the same, or similar, material as that of the substrate 106, for example, silicon or silicon carbide.

The support ring 134 rests on a rotatable tubular quartz cylinder 136 that is coated with silicon to render it opaque in the frequency range of the pyrometer 128. The silicon coating on the quartz cylinder 136 acts as a baffle to block out radiation from the external sources that might contaminate the intensity measurements. The bottom of the quartz cylinder 136 is held by an annular upper bearing 141 which rests on a plurality of ball bearings 137 that are, in turn, held within a stationary, annular, lower bearing race 139. In some embodiments, the ball bearings 137 are made of steel and coated with silicon nitride to reduce particulate formation during operations. The upper bearing 141 is magnetically coupled to an actuator (not shown) which rotates the cylinder 136, the edge ring 134 and the substrate 106 during the thermal processing.

A purge ring 145, which is fitted into the chamber body, surrounds the quartz cylinder 136. In some embodiments, the purge ring 145 has an internal annular cavity 147 which opens up to a region above the upper bearing 141. The internal cavity 147 is connected to a gas supply (not shown) through a passageway 149. During processing, a purge gas is flowed into the chamber through the purge ring 145. Gases are exhausted through an exhaust port, which is coupled to a vacuum pump (not shown).

In some embodiments, the support ring 134 has an outer radius that is larger than the radius of the quartz cylinder 136 so that it extends out beyond the quartz cylinder 136. The annular extension of the support ring 134 beyond the cylinder 136, in cooperation with the purge ring 145 located below it, functions as a baffle which prevents stray light from entering the reflecting cavity 118 at the backside of the substrate 106. To further reduce the possibility of stray light entering into the reflecting cavity 118, the support ring 134 and the purge ring 145 may also be coated with a material (for example, a black or gray material) that absorbs the radiation generated by the lamphead 101.

The window assembly 114 is disposed in an upper portion of the process chamber 100 to allow light energy provided by the lamphead 101 to enter the process chamber 100. In some embodiments, the window assembly 114 includes an upper window 154 and a lower window 156. The upper window 154 and the lower window 156 each comprise a material transparent to the energy provided by the lamphead 101 to allow radiation from the lamphead 101 to enter the process chamber 100 therethrough. In some embodiments, the upper window 154 and the lower window 156 are quartz. However, the upper window 154 and the lower window 156 may be made out of different materials as well.

Generally, the upper window 154 and the lower window 156 are configured to allow the maximum energy provided by the lamphead 101 to pass therethrough. In some embodiments, a thickness of the upper window 154 and/or the lower window 156 may be varied to control the quantity of energy passing therethrough. For example, in some embodiments the thickness of the upper window may be between about 3 to about 8 mm. In some embodiments, the thickness of the lower window may be between about 3 to about 8 mm.

During processing, a process gas can be introduced into the process chamber 100 above the substrate 106 through the window assembly 114. The window assembly 114 may be used to more uniformly distribute the process gas to the substrate 106 from overhead, as compared to process chambers utilizing side injecting gas systems (e.g., delivering gas into the processing volume of the process chamber from the sides of the process chamber)

In some embodiments, the lower window 156 is disposed below the upper window 154 and is spaced apart therefrom, to define a gap 158 therebetween. The gap 158 forms a plenum for receiving and flowing the process gas therein from the inlet 130. In some embodiments, the gap may be between about 1-5 mm. The lower window 156 includes one or more outlets 160 for delivering a process gas from the plenum (e.g., the gap 158) into the processing volume of the process chamber 100. The size, geometry, number, and location of the one or more outlets 160 can be selectively chosen to facilitate a desired pattern of process gas flow.

For example, a cross section of each outlet 160 may be round, rectangular, square, oval, slotted, polygonal, or the like or combinations thereof. Each outlet 160 may have a cross-section configured, for example, control the flow rate and/or direction of a process gas flowing therefrom. In some embodiments, at least some outlets 160 may have a cross section that varies along an axis parallel to the direction of gas flow. For example, in some embodiments, at least some outlets 160 may have an expanding cross section to facilitate dispersing the process gas flowing therethrough. For example, at least some outlets 160 may have a first width proximate an upper surface of the lower window 156 that is less than a second width proximate a lower, substrate support-facing surface of the lower window 156. In some embodiments, at least some outlets 160 may have a tapering cross section to facilitate providing a higher velocity of the process gas flowing therethrough. For example, at least some outlets 160 may have a first width proximate the upper surface of the lower window 156 that is greater than a second width proximate the lower, substrate support-facing surface of the lower window 156. In some embodiments, at least some outlets 160 may have a non-vertical central axis to facilitate directing the flow of the process gas flowing therethrough at a non-perpendicular angle to the substrate.

The one or more outlets 160 may be distributed in the lower window 156 in any suitable configuration to achieve a desired distribution of a process gas to the substrate 106. The desired distribution may be uniform or non-uniform, depending upon the process being performed in the process chamber. For example, and as depicted in FIG. 3A, a plurality of outlets 160 may be distributed as desired in two dimensions across the surface of the lower window 156. In some embodiments, the plurality of outlets 160 may be uniformly distributed across the entire surface of the lower window 156. In some embodiments, the plurality of outlets 160 may be grouped into one or more desired zones, such as an outer zone 302, an intermediate zone 304, and an inner zone 306, as illustratively depicted in FIG. 3A. In such a configuration of the one or more outlets 160, the substrate support 108 may be stationary or rotating about a central axis.

In some embodiments, and as depicted in FIG. 3B, a plurality of outlets 160 may be distributed along a segment 308 of the surface of the lower window 156, such as in a line (although multiple lines, wedges, multiple lines or wedges, multiple segments, or the like may also be used). The segment 308 may span at least about the width of the substrate 106 and may extend at least over a central axis of the substrate 106. In such an embodiment, the substrate support 108 may be rotated during processing to facilitate uniform distribution of the process gas to the substrate 106. Other distributions of the one or more outlets 160 may be utilized as well. For example, non-uniform distributions to compensate for non-uniform gas flow caused by configurational asymmetries in a process chamber, for instance, an exhaust port positioned asymmetrical with respect to a processing volume.

Figure 2:
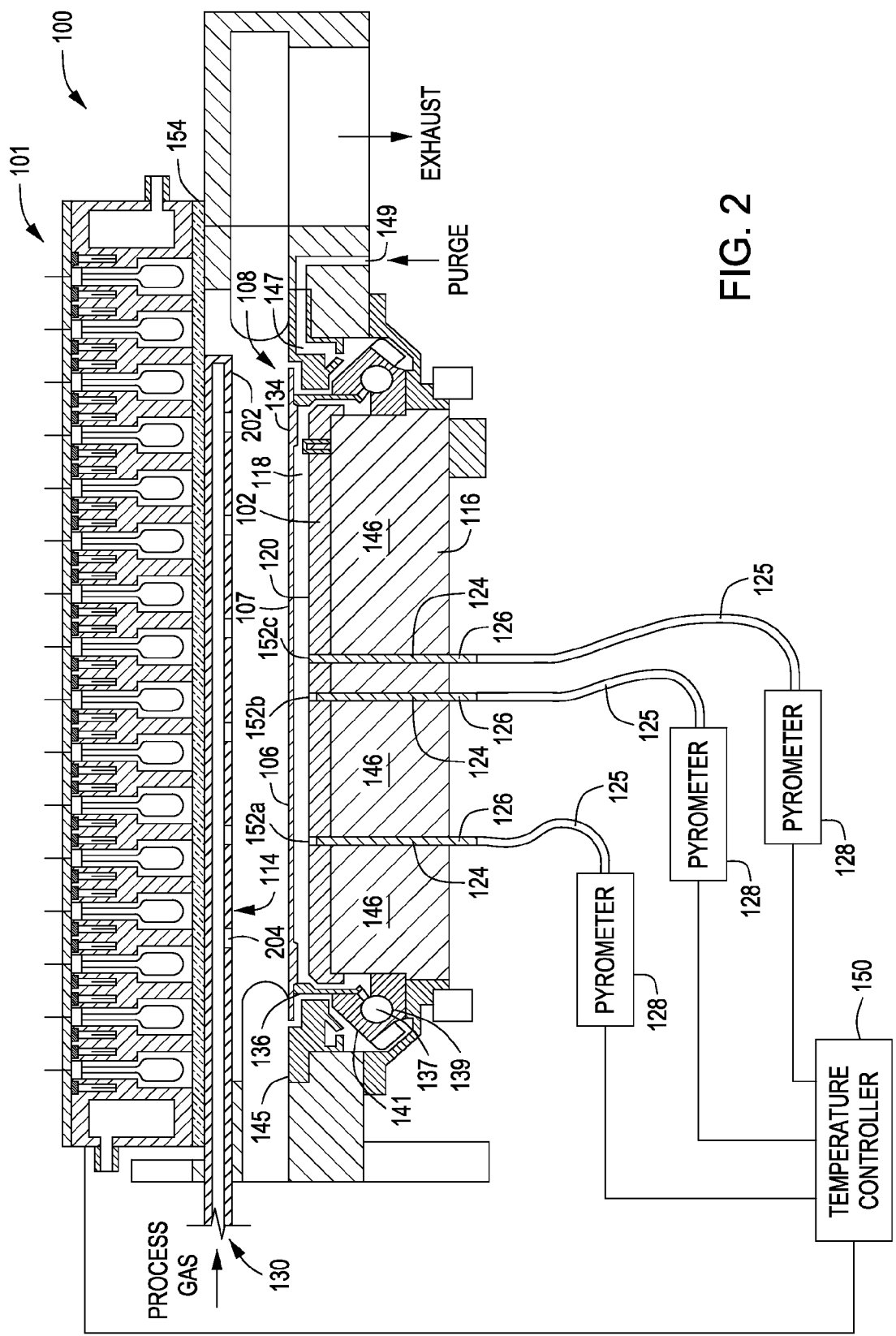
FIG. 2 depicts schematic side view of a rapid thermal processing system in accordance with some embodiments of the present invention.

An alternative embodiment of the window assembly 114 that may be utilized in the process chamber 100 is depicted in FIG. 2. The window assembly 114 may include the upper window 254 and a conduit 202 disposed below the upper window 254. The upper window 154 may be similar to the upper window 154 discussed above. The conduit 202 may be fabricated from any suitable material that is transparent to radiation from the lamphead 101. Such materials may include quartz, cinnabar, calcite or the like. In some embodiments, the conduit 202 may be supported from a side of the process chamber 100. In some embodiments, the conduit 202 may be coupled to the upper window 254 by any suitable fastening mechanism that is transparent to the energy provided by the lamphead 101. For example, the conduit 202 may be glued, bonded, or welded to the upper window 154.

The conduit 202 is coupled to the inlet 130 and is configured for flowing a process gas therein. The conduit 202 has one or more outlets 204 disposed through a lower surface thereof to facilitate the flow of the process gas into the processing volume of the process chamber 100. The outlets may be uniformly or non-uniformly distributed and may otherwise have a shape and/or cross-section as discussed above with respect to the outlets 160.

The location of the one or more outlets 204 with respect to, for example, the substrate support 108, is primarily controlled by the geometry of the conduit 202. The conduit 202 may have any suitable configuration necessary to provide a desired flow of process gas to the substrate 106. For example, in some embodiments and as depicted in FIG. 2, the conduit 202 may extend at least the width of the substrate 106. In some embodiments, the conduit 202 may extend along a line which intersects with a central axis of the substrate support 108. Other configurations of the conduit are possible and discussed below with respect to FIGS. 5A-D.

Figure 5A:
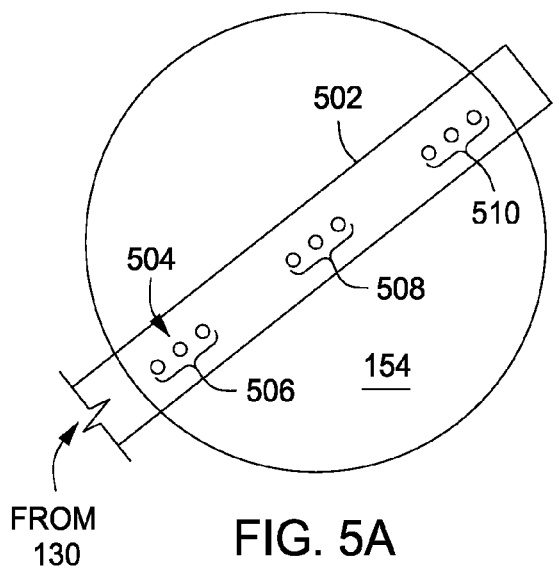
FIGS. 5A-D illustratively depict examples of a portion of a gas delivery system of a rapid thermal processing system in accordance with some embodiments of the present invention.

The conduit 202 may be configured in any geometry which facilitates a desired distribution of a process gas or gases to the substrate 106. For example, the conduit 202 may be linear or non-linear and may have one or more outlets 204 of similar or varying size, grouped into zones, clustered, or uniformly distributed, or the like. FIGS. 5A-D depict schematic bottom views the upper window 154 showing some of the many various conduit configurations contemplated herein. As depicted in FIG. 5A, a conduit 502 (similar to conduit 202) may be linear and may extend at least the width of the substrate 106 (shown in FIG. 5A as extend greater than the width of the upper window 154). The conduit 502 has one or more outlets 504 (similar to outlets 204) formed therein along desired portions of the conduit 502 to facilitate providing a process gas to a desired location in the process chamber. In the embodiment depicted in FIG. 5A, a plurality of outlets 504 are depicted. In some embodiments, the outlets 504 may be grouped into one or more regions, or zones (e.g., 506, 508, 510 illustrated in FIG. 5A). The outlets 504 may be configured identically or differently from within each zone and from zone-to-zone.

Figure 5B:
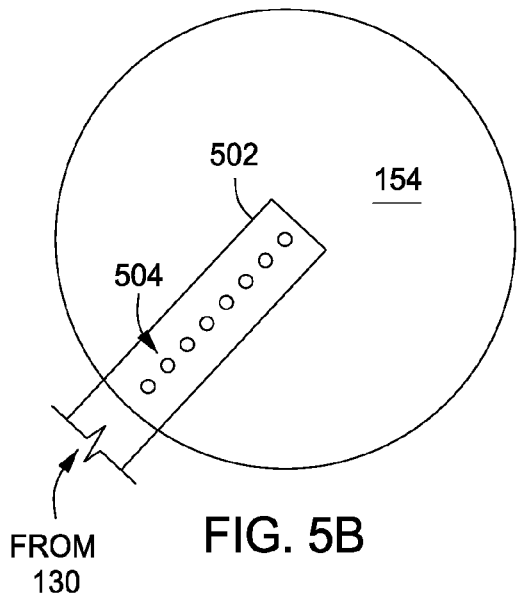

As shown in FIG. 5B, a conduit 502 may extend a sufficient distance to intersect with a central axis of the substrate 106 (e.g., past a central point of the upper window 154). The conduit 502 as shown in FIG. 5B may be used in combination with a substrate support configured for rotation as discussed above to facilitate providing the desired gas distribution during processing. The conduit 502 of FIG. 5B has a one or more outlets 504 that may be configured similarly as discussed above with respect to FIG. 5A.

Figure 5C:
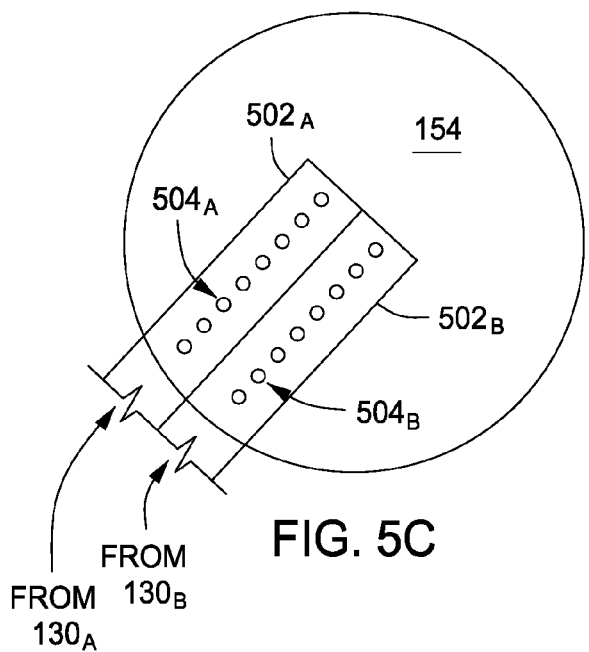

As shown in FIG. 5C, two or more conduits, a conduit $502_A$ and a second conduit $502_B$ as shown, may be provided. Each conduit $502_{A-B}$ includes one or more outlets $504_A$ and $504_B$ that may be configured similarly as discussed above with respect to FIGS. 5A-B. Each conduit may be coupled to the same or a different gas source for providing different quantities of process gases or different process gases (including process gases having similar constituents in differing percentages) to the process chamber during processing. For example, conduit $502_A$ may be coupled to a first inlet $130_A$ and conduit $502_B$ may be coupled to a second inlet $130_B$ (inlets $130_{A-B}$ similar to inlet 130 discussed above with respect to FIG. 1) to facilitate providing different process gases to the process chamber during processing. Alternatively or in combination, outlets $504_A$ and outlets $504_B$ may be provided in different sizes, and/or numbers, and/or zones to facilitate providing different quantities of the process gases to different regions of the process chamber during processing.

Figure 5D:
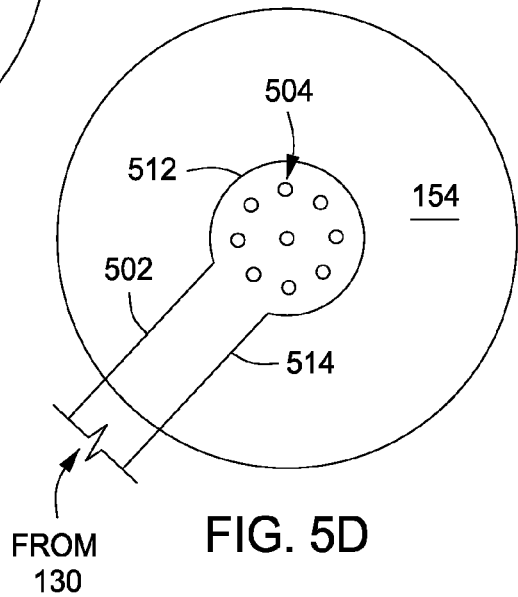

Referring to FIG. 5D, another exemplary embodiment of a conduit 502 is shown. The conduit 502 includes a first portion 512 and a second portion 514. The first portion 512 may have a desired configuration to provide process gases proximate a center of the process chamber (e.g., the first portion 512 is disposed proximate the center of the upper window 154). The first portion 512 includes one or more outlets 504 in a desired pattern facing the processing volume of the process chamber. The first portion 512 may have a different geometry than the second portion 514. For example, as depicted in FIG. 5D, the first portion 512 is round with a diameter that is larger than the width of the second portion 514 (although other shapes and configurations of the first portion 512 may also be used). The second portion 514 connects the first portion 512 of the conduit 502 to the inlet 130 of the process chamber.

FIGS. 5A-D illustratively depict only some examples of the conduit 504 and other configurations are possible. For example, the conduit 504 may have other shapes, such as elliptical, square, rectangular, and the like. Further, it is contemplated that the window assembly may comprise multiple conduits, or single branching conduits. In embodiments where multiple conduits are used, each conduit may provide the same process gas, or may be used to provide a different process gas, as discussed above with respect to FIG. 5C.

In operation, the window assembly may be utilized to provide process gases to a process chamber in a desired pattern. For example, one exemplary method 400 for providing a process gas to a substrate disposed in a process chamber is depicted in FIG. 4. The method 400 may be performed in any suitable process chamber which requires the input of a process gas and the heating of a substrate by a light source. Processing may include formation of a layer atop the substrate, for example, an oxide layer by an selective oxidation process such as radical oxidation, or the like. One exemplary chamber which may be utilized with the method 400 is process chamber 100 having the window assembly 114. The method 400 is described below with respect to process chamber 100 having window assembly 114 as depicted in FIG. 1.

The method 400 generally begins at 402, where a gas may be provided to the inlet 130 of the window assembly 114 disposed in the process chamber 100 between the substrate support 108 and the light source 101 configured to direct energy towards the substrate support 108. The gas may be any suitable gas for processing the substrate. Where multiple gases are provided, the gases may be flowed individually or in a process gas mixture. Each gas may be flowed individually (such as via the conduit $502_A$ and the second conduit $502_B$ as shown in FIG. 5C, or by flowing the gases serially through any of the embodiments disclosed herein) or in a process gas mixture (via any of the embodiments disclosed herein).

In some embodiments, the gas may be utilized as part of an oxidation process, such as selective oxidation of the substrate 106 and may comprise oxygen ($O_2$), nitrogen ($N_2$), hydrogen ($H_2$), ammonia ($NH_3$), nitrous oxide ($N_2O$), nitric oxide (NO), or combinations thereof. In some embodiments, the gas mixture comprises oxygen ($O_2$) and nitrogen ($N_2$). In some embodiments, the gas may be utilized as part of an annealing process and may comprise nitrogen ($N_2$), ammonia ($NH_3$), hydrogen ($H_2$), or the like. In some embodiments, the process gas may further include an inert gas, such as helium (He), argon (Ar), or the like. Other processes and gas combinations may also be utilized.

Next, at 404, the gas may be flowed through the window assembly 114. For example, in some embodiments, the gas may be flowed from the inlet 130 into the gap 158 between the upper window 154 and the lower window 156 of the window assembly 114. In some embodiments, the gas may be flowed from the inlet 130 into the conduit (204, 504) disposed beneath the upper window 156 of the window assembly 114. In some embodiments, independent control and/or distribution of multiple gases may be provided. For example, a first gas or gas mixture may be provided to from a first inlet $130_A$ to a first conduit $504_A$ and a second gas or gas mixture may be provided to from a second inlet $130_B$ to a second conduit $504_B$.

Next, at 406, the gas may be flowed into the process chamber 100 through one or more outlets (e.g., 160, 204, 504) disposed in the window assembly 114. The process gas may flowed through the one or more outlets 160 in a desired pattern (e.g., uniform or non-uniform) into the process chamber 100. The process gas may be flowed in any suitable direction and/or at any suitable flow rate as determined by the one or more outlets 160 and/or by the flow rate of the process gas provided by a process gas source to provide a desired distribution of the process gas to the surface of the substrate 106. Depending on the configuration of the one or more outlets, the substrate 106 may be rotated during processing to facilitate the desired gas distribution, as discussed above.

In some embodiments, a growth rate of an oxide layer formed on the substrate may be increased by providing the process gases from the window assembly facing the substrate, as compared to injecting gases from the side of the process chamber. In some embodiments, control over an oxide film thickness may be provided, for example, in a center and/or middle zone of the substrate, by controlling the flow of an oxidation gas, such as oxygen ($O_2$). In some embodiments, a cool down rate in a center and/or middle zone of the substrate may be increased by increasing the flow of an inert gas, such as nitrogen ($N_2$) provided from the window assembly facing the substrate, as compared to injecting gases from the side of the process chamber. Upon providing the process gas and/or process gas mixture to the substrate surface, the method 400 generally ends and the substrate 106 may be further processed as necessary.

Thus, methods and apparatus for providing a process gas to a substrate are disclosed herein. The inventive apparatus may include a window assembly for facilitating the flow of a process gas into a process chamber. The inventive system and methods advantageously facilitates a desired distribution of the process gas to a substrate disposed in a process chamber, for example, such as a process chamber configured for a rapid thermal process (RTP).

While the foregoing is directed to embodiments of the present invention, other and further embodiments of the invention may be devised without departing from the basic scope thereof.

The invention claimed is:

1. A substrate processing system, comprising:
 a process chamber having a substrate support disposed therein;
 a light source disposed above the process chamber to direct energy towards the substrate support; and
 a window assembly disposed between the light source and the substrate support to allow light energy provided by the light source to enter the process chamber towards the substrate support, wherein the window assembly includes an inlet to receive a process gas, one or more outlets to distribute the process gas into the process chamber, an upper window, and a conduit disposed below the upper window and having the inlet disposed at a first end thereof to receive the process gas, wherein the conduit has one or more outlets to flow the process gas into the process chamber.

2. The system of claim 1, wherein at least one of the one or more outlets are round, rectangular, square, oval, polygonal, slotted, or combinations thereof.

3. The system of claim 1, wherein at least one of the one or more outlets has a varying cross-section along an axis parallel to the direction of gas flow.

4. The system of claim 1, wherein at least one of the one or more outlets has a central axis that is non-perpendicular to a support surface of the substrate support.

5. The system of claim 1, wherein the substrate support rotates about a central axis.

6. The system of claim 1, wherein the one or more outlets are disposed in two or more zones.

7. The system of claim 1, wherein the one or more outlets are symmetrically arranged in a region opposite the substrate support.

8. The system of claim 1, wherein the one or more outlets are asymmetrically arranged in a region opposite the substrate support.

9. The system of claim 1, wherein the one or more outlets are disposed in a linear arrangement.

10. The system of claim 1, wherein the conduit extends along a line which intersects a central axis of the substrate support.

11. The system of claim 1, wherein the conduit extends across only a portion of the upper window.

12. The system of claim 1, wherein the window assembly further comprises:
 a second conduit disposed below the upper window to flow a second process gas therethrough and having one or more second outlets disposed therethrough to facilitate the flow of the second process gas into the process chamber.

13. A method for providing a process gas to a substrate, comprising:
 providing a gas to an inlet of a window assembly disposed in a process chamber between a substrate support and a light source configured to direct energy towards the substrate support;
 flowing the gas through a conduit disposed beneath an upper window of the window assembly; and
 flowing the gas into the process chamber through one or more outlets disposed in the window assembly, wherein the one or more outlets are disposed in the conduit.

14. The method of claim 13, further comprising:
 flowing a second gas through a second conduit disposed beneath the upper window and having one or more outlets are disposed in the second conduit to facilitate flow of the second gas into the process chamber.

15. The method of claim 13, wherein the one or more outlets disposed in the window assembly are asymmetrically arranged, and further comprising:
 rotating the substrate support to provide uniform distribution of the process gas across a surface of a substrate disposed on the substrate support.

16. The method of claim 13, further comprising:
 directing energy from the light source into the process chamber through the window assembly while flowing the gas through the window assembly.

17. A substrate processing system, comprising:
 a process chamber having a substrate support disposed therein;
 a light source disposed above the process chamber to direct energy towards the substrate support; and
 a window assembly disposed between the light source and the substrate support to allow light energy provided by the light source to enter the process chamber towards the substrate support, wherein the window assembly includes an inlet to receive a process gas and one or more outlets asymmetrically arranged in a region opposite the substrate support to distribute the process gas into the process chamber.

18. The substrate processing system of claim 17, further comprising a substrate support which rotates about a central axis.

19. A method for providing a process gas to a substrate, comprising:
 providing a gas to an inlet of a window assembly disposed in a process chamber between a substrate support and a light source configured to direct energy towards the substrate support;
 flowing the gas through the window assembly;

flowing the gas into the process chamber through one or more asymmetrically arranged outlets disposed in the window assembly; and rotating the substrate support to provide uniform distribution of the process gas across a surface of a substrate disposed on the substrate support.

20. A substrate processing system, comprising:

a process chamber having a substrate support disposed therein;

a light source disposed above the process chamber to direct energy towards the substrate support; and a window assembly disposed between the light source and the substrate support to allow light energy provided by the light source to enter the process chamber towards the substrate support, wherein the window assembly includes an inlet to receive a process gas and one or more outlets to distribute the process gas into the process chamber, wherein the one or more outlets are either symmetrically or asymmetrically arranged in a region opposite the substrate support, and wherein at least one of the one or more outlets has at least one of a varying cross-section along an axis parallel to the direction of gas flow or a central axis that is non-perpendicular to a support surface of the substrate support.

* * * * *